US012791623B2

(12) United States Patent
Fujii et al.

(10) Patent No.: US 12,791,623 B2
(45) Date of Patent: Nov. 10, 2026

(54) BATTERY STATE ESTIMATION DEVICE, BATTERY STATE ESTIMATION SYSTEM, AND BATTERY STATE ESTIMATION METHOD

(71) Applicant: Nuvoton Technology Corporation Japan, Kyoto (JP)

(72) Inventors: Keiichi Fujii, Shiga (JP); Hitoshi Kobayashi, Osaka (JP); Tomohiro Okachi, Kyoto (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 413 days.

(21) Appl. No.: 18/524,902

(22) Filed: Nov. 30, 2023

(65) Prior Publication Data

US 2024/0094303 A1 Mar. 21, 2024

Related U.S. Application Data

(63) Continuation of application No. PCT/JP2022/022604, filed on Jun. 3, 2022.

(30) Foreign Application Priority Data

Jun. 4, 2021 (JP) ................................. 2021-094149

(51) Int. Cl.
*G01R 31/392* (2019.01)
*G01R 31/367* (2019.01)
(Continued)

(52) U.S. Cl.
CPC ......... *G01R 31/392* (2019.01); *G01R 31/367* (2019.01); *G01R 31/382* (2019.01); *G01R 31/389* (2019.01)

(58) Field of Classification Search
CPC .. G01R 31/392; G01R 31/367; G01R 31/382; G01R 31/389; G01R 31/3842; G01R 31/387; H01M 10/48; Y02E 60/10
See application file for complete search history.

(56) References Cited

U.S. PATENT DOCUMENTS

2010/0244886 A1 9/2010 Kawahara et al.
2013/0110429 A1* 5/2013 Mitsuyama .......... G01R 31/367 702/63
(Continued)

FOREIGN PATENT DOCUMENTS

JP 2010-256323 A 11/2010
JP 2011-214843 A 10/2011
(Continued)

OTHER PUBLICATIONS

International Search Report dated Aug. 16, 2022 issued in International Patent Application No. PCT/JP2022/022604, with English translation.

*Primary Examiner* — Shelby A Turner
*Assistant Examiner* — Yaritza H Perez Bermudez
(74) *Attorney, Agent, or Firm* — Rimon P.C.

(57) ABSTRACT

A battery state estimation device includes: a first state of charge (SOC) calculator that calculates a first SOC using a first method that uses the battery model parameter of a battery; a second SOC calculator that calculates a second SOC using a second method different from the first method; an alternating-current (AC) impedance measurement unit that measures the AC impedance of the battery when the error between the first SOC and the second SOC is greater than a predetermined threshold; and a battery model parameter calculator that calculates a battery model parameter using the measured AC impedance. The first SOC calculator recalculates the first SOC using the battery model parameter calculated.

10 Claims, 7 Drawing Sheets

(51) Int. Cl.

| | |
|---|---|
| ***G01R 31/382*** | (2019.01) |
| ***G01R 31/389*** | (2019.01) |

(56) References Cited

U.S. PATENT DOCUMENTS

| | | | | |
|---|---|---|---|---|
| 2013/0229156 | A1* | 9/2013 | Brandon | B60L 3/0046 320/136 |
| 2017/0104248 | A1* | 4/2017 | Lim | H01M 10/486 |
| 2019/0288344 | A1 | 9/2019 | Nakao et al. | |
| 2021/0109160 | A1* | 4/2021 | Matsukawa | G01R 31/389 |
| 2021/0349155 | A1* | 11/2021 | Srinivasan | G01R 31/389 |
| 2022/0082631 | A1* | 3/2022 | Wild | G01R 31/392 |
| 2022/0212545 | A1* | 7/2022 | Araujo Xavier | B60L 15/20 |
| 2022/0302724 | A1* | 9/2022 | Sharma | H02J 3/32 |
| 2023/0408588 | A1* | 12/2023 | Jiang | G01R 31/382 |
| 2025/0306119 | A1* | 10/2025 | Shen | G01R 31/389 |

FOREIGN PATENT DOCUMENTS

| | | | |
|---|---|---|---|
| JP | 2013-537638 | A | 10/2013 |
| WO | 2012/025706 | A1 | 3/2012 |
| WO | 2017/199629 | A1 | 11/2017 |
| WO | 2020/003841 | A1 | 1/2020 |

* cited by examiner

BATTERY STATE ESTIMATION DEVICE, BATTERY STATE ESTIMATION SYSTEM, AND BATTERY STATE ESTIMATION METHOD

CROSS REFERENCE TO RELATED APPLICATIONS

This is a continuation application of PCT International Application No. PCT/JP2022/022604 filed on Jun. 3, 2022, designating the United States of America, which is based on and claims priority of Japanese Patent Application No. 2021-094149 filed on Jun. 4, 2021. The entire disclosures of the above-identified applications, including the specifications, drawings and claims are incorporated herein by reference in their entirety.

FIELD

The present invention relates to a battery state estimation device, a battery state estimation system, and a battery state estimation method.

BACKGROUND

In recent years, vehicles such as hybrid electric vehicles (HEVs) and electric vehicles (EVs) which travel using secondary batteries as a power supply have been developed. Lithium-ion batteries (LiBs) are used as secondary batteries, for example. To use such secondary batteries safely, state of charge (SOC) or state of health (SOH) is calculated for battery state estimation in a battery management system (BMS). For example, Patent Literature (PTL) 1 discloses the technique of calculating SOH based on a battery simulation model.

CITATION LIST

Patent Literature

PTL 1: Japanese Unexamined Patent Application Publication No. 2011-214843

SUMMARY

Technical Problem

The present disclosure has an object to provide a battery state estimation device, a battery state estimation system, and a battery state estimation method that can achieve highly accurate battery state estimation.

Solution to Problem

A battery state estimation device according to one aspect of the present disclosure includes: a first state of charge (SOC) calculator that calculates a first SOC using a first method that uses the battery model parameter of a battery; a second SOC calculator that calculates a second SOC using a second method different from the first method; an alternating-current (AC) impedance measurement unit that measures the AC impedance of the battery when the error between the first SOC and the second SOC is greater than a predetermined threshold; and a battery model parameter calculator that calculates a battery model parameter using the measured AC impedance. The first SOC calculator recalculates the first SOC using the calculated battery model parameter.

Advantageous Effects

The present disclosure can provide a battery state estimation device, a battery state estimation system, and a battery state estimation method that can achieve highly accurate battery state estimation.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

Figure 1:
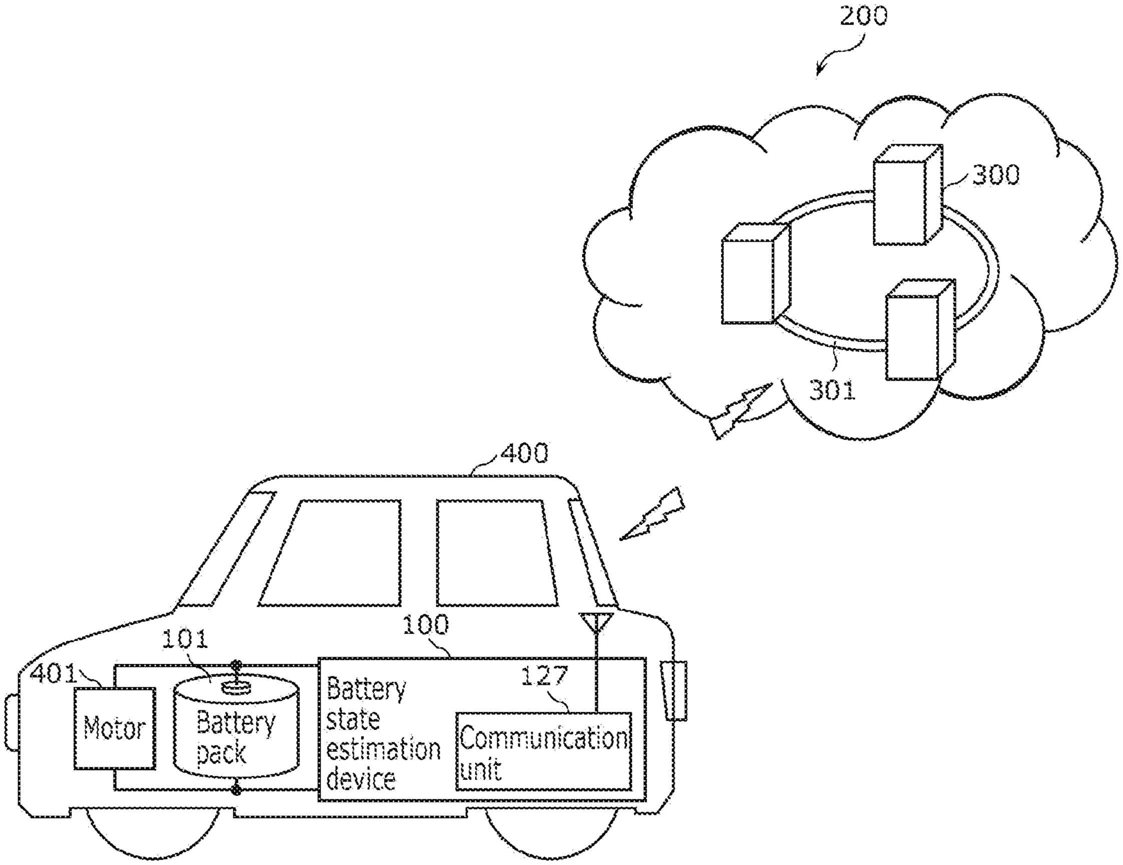
FIG. 1 is a diagram illustrating the outline of a battery state estimation system according to an embodiment.

A battery state estimation device according to one aspect of the present disclosure includes: a first state of charge (SOC) calculator that calculates a first SOC using a first method that uses the battery model parameter of a battery; a second SOC calculator that calculates a second SOC using a second method different from the first method; an alternating-current (AC) impedance measurement unit that measures the AC impedance of the battery when the error between the first SOC and the second SOC is greater than a predetermined threshold; and a battery model parameter calculator that calculates a battery model parameter using the measured AC impedance. The first SOC calculator recalculates the first SOC using the calculated battery model parameter.

According to this, the battery state estimation device can enhance, by using a second SOC as a reference, the accuracy of a first SOC and the accuracy of a battery model parameter to be calculated. Thus, the battery state estimation device can achieve highly accurate battery state estimation.

The battery state estimation device may also include, for example, a controller that when the error between the first SOC and the second SOC is less than the predetermined threshold, updates a battery model parameter stored in a storage unit with the battery model parameter used for the calculation of the first SOC.

The first method may be, for example, a Kalman filtering (KF) method.

The second method may be, for example, a Coulomb counting (CC) method.

The second method may be, for example, an open circuit voltage (OCV) method.

For example, the AC impedance measurement unit may measure the AC impedance during charge or discharge of the battery.

For example, the AC impedance measurement unit may measure the AC impedance when the battery is in thermal equilibrium.

For example, the storage unit may be included in a server device provided in a location different from the location of the battery state estimation device, and the battery state estimation device may further include a communication unit that communicates with the server device via a communication network.

A battery state estimation system according to one aspect of the present disclosure includes the battery state estimation device and the server device. The storage unit stores the initial battery model parameter of the battery, and the server device estimates the state of degradation of the battery using the initial battery model parameter and the updated battery model parameter.

A battery state estimation method according to one aspect of the present disclosure includes: calculating a first state of charge (SOC) using a first method that uses the battery model parameter of a battery; calculating a second SOC using a second method different from the first method; measuring the alternating-current (AC) impedance of the battery when the error between the first SOC and the second SOC is greater than a predetermined threshold; calculating a battery model parameter using the measured AC impedance; and recalculating the first SOC using the calculated battery model parameter.

According to this, the battery state estimation method can enhance, by using a second SOC as a reference, the accuracy of a first SOC and the accuracy of a battery model parameter to be calculated. Thus, the battery state estimation method can achieve highly accurate battery state estimation.

Note that these general or specific aspects may be achieved by a system, a method, an integrated circuit, a computer program, a computer-readable recording medium such as a CD-ROM, or any combination thereof.

Hereinafter, embodiments of the present disclosure will be described in detail with reference to the drawings. Note that each of the embodiments described below shows a specific example of the present disclosure. Numerical values, shapes, materials, elements, the arrangement and connection of the elements, steps, orders of steps, etc., indicated in the following embodiments are merely examples, and do not intend to limit the present disclosure.

The figures are schematic diagrams and are not necessarily precise illustrations. Elements that are essentially the same share like reference signs in the figures, and duplicate description is omitted or simplified.

Embodiment

First, the configuration of a battery state estimation system according to the present embodiment will be described. FIG. 1 is a diagram illustrating the outline of battery state estimation system 200 according to the present embodiment.

As illustrated in FIG. 1, battery state estimation system 200 includes battery state estimation device 100 and server device 300. Server device 300 is disposed in a location separate from the location of battery state estimation device 100. Server device 300 is a so-called cloud server and is connected to, for example, another server device via cloud network 301 for communication.

Battery state estimation device 100, which is mounted in, for example, vehicle 400 such as an EV, monitors battery pack 101 for driving motor 401 of vehicle 400 and estimates the state of battery pack 101. Communication unit 127 included in battery state estimation device 100 transmits, for example, the AC impedance of battery pack 101 that has been calculated to server device 300 via a wireless communication. A relay device, which is not shown in FIG. 1, may be interposed between communication unit 127 and server device 300.

An example here shows that the battery state estimation system and the battery state estimation device according to the present disclosure are used in an EV, but the present disclosure is applicable to any system that uses battery packs.

Figure 2:
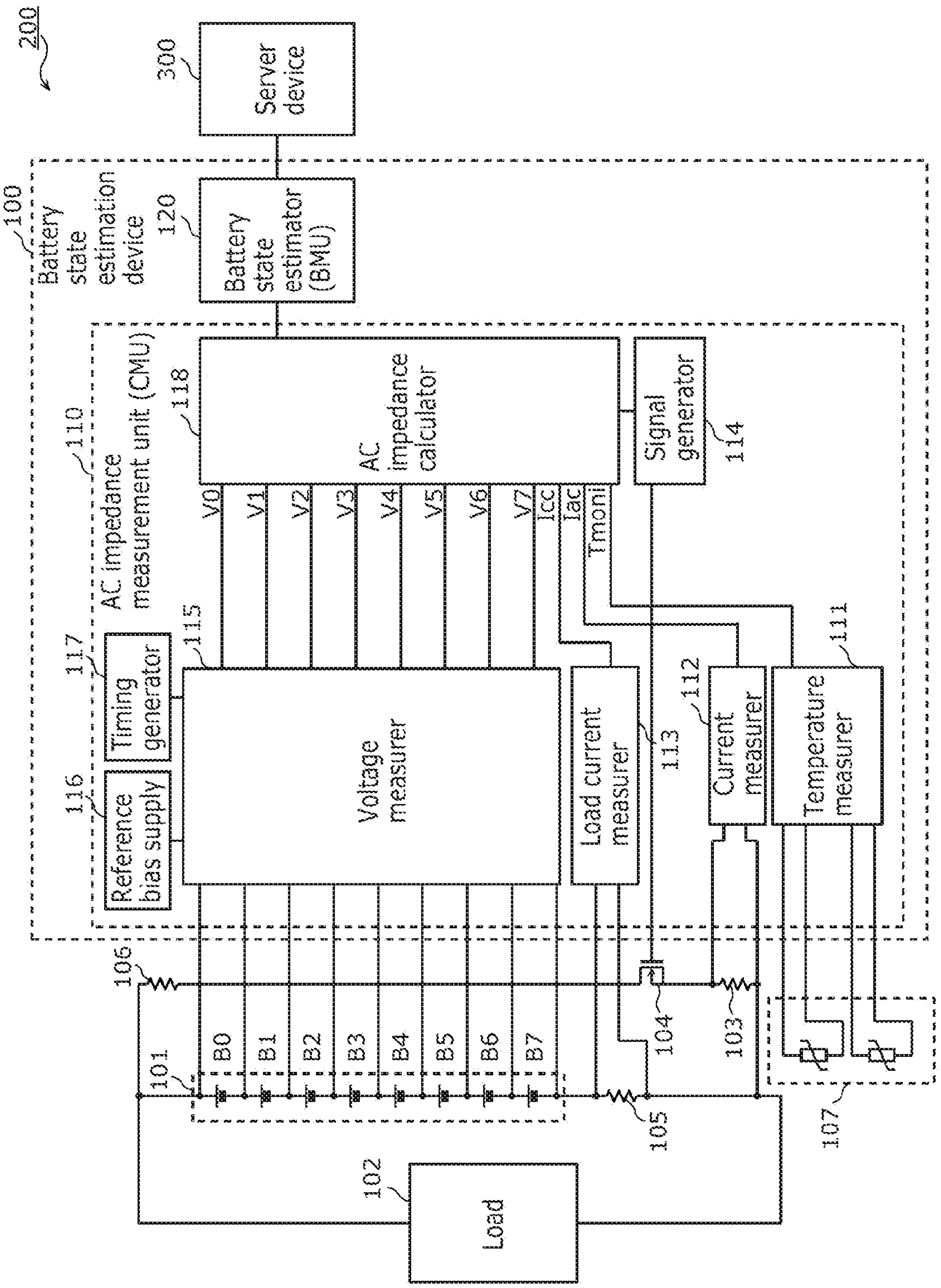
FIG. 2 is a block diagram illustrating the battery state estimation system according to the embodiment.

FIG. 2 is a block diagram illustrating battery state estimation system 200 according to the present embodiment. Battery pack 101 includes batteries B0 through B7 (hereinafter, any one of batteries B0 through B7 is referred to as battery B). Stated differently, battery B is a battery cell. Specifically, battery B is a lithium-ion battery, but may be any other battery such as a nickel metal hydride battery. Battery pack 101 functions as the power supply of load 102 and supplies power to load 102. Load 102 is, for example, the motor of an EV, but is not particularly limited. A battery charger for charging battery pack 101, instead of load 102, may be connected at the location of load 102.

Battery state estimation system 200 includes reference resistance 103, transistor 104, reference resistance 105, load resistance 106, temperature sensor 107, battery state estimation device 100, and server device 300.

Reference resistance 103 is a resistance disposed on a path different from a path along which current flows from battery pack 101 to load 102. In other words, reference resistance 103 is a resistance through which current flowing through load 102 does not flow.

Transistor 104 is a transistor for allowing current to flow from battery pack 101 to reference resistance 103. Transistor 104 is, for example, a field effect transistor (FET), but may be a bipolar transistor. The drain of transistor 104 is connected to load resistance 106, the source of transistor 104 is connected to reference resistance 103, and the gate (i.e., control terminal) of transistor 104 is connected to signal generator 114.

Battery state estimation device 100 includes AC impedance measurement unit 110 and battery state estimator 120. AC impedance measurement unit 110 measures the AC impedance of battery pack 101. Battery state estimator 120 estimates the battery state of battery pack 101 using the measured AC impedance. Battery state estimation device 100 includes, for example, one or more integrated circuits.

AC impedance measurement unit 110 is, for example, a lower-level cell management unit (CMU) that measures and manages individual battery cells in a battery pack. In contrast, battery state estimator 120 is a battery management unit (BMU) in a higher-level system that manages the whole battery pack. Such a division of functions is one example and the present disclosure is not limited to this example.

AC impedance measurement unit 110 includes temperature measurer 111, current measurer 112, load current measurer 113, signal generator 114, voltage measurer 115, reference bias supply 116, timing generator 117, and AC impedance calculator 118.

Temperature measurer 111 measures temperature Tmoni of temperature sensor 107. Temperature sensor 107 is, for example, a temperature sensor that uses a thermistor, but may be a temperature sensor that uses any other element such as a thermocouple.

Current measurer 112 measures current Iac that flows through reference resistance 103. Specifically, current measurer 112 measures current Iac by measuring voltages at both ends of reference resistance 103. Load current measurer 113 measures current Icc that flows through load 102. Specifically, load current measurer 113 measures current Icc by measuring voltages at both ends of reference resistance 105. Signal generator 114 applies a control signal to the control terminal of transistor 104.

Voltage measurer 115 measures voltages V0 through V7 of batteries B0 through B7 included in battery pack 101. Voltage measurer 115 includes, for example, AD converters.

Reference bias supply 116 supplies a reference voltage to the AD converters included in voltage measurer 115. Timing generator 117 supplies, to the AD converters included in voltage measurer 115, a timing signal for synchronizing the measurement timings of the AD converters.

AC impedance calculator 118 calculates the AC impedances of batteries B0 through B7 based on current Iac measured by current measurer 112 and voltages V0 through V7 measured by voltage measurer 115. Specifically, AC impedance calculator 118 calculates AC impedance Zn of battery Bn by dividing voltage Vn by current Iac. Here, n is any one of 0 to 7. Each of the AC impedances is a complex number and has real component Zre and imaginary component Zim.

Figure 3:
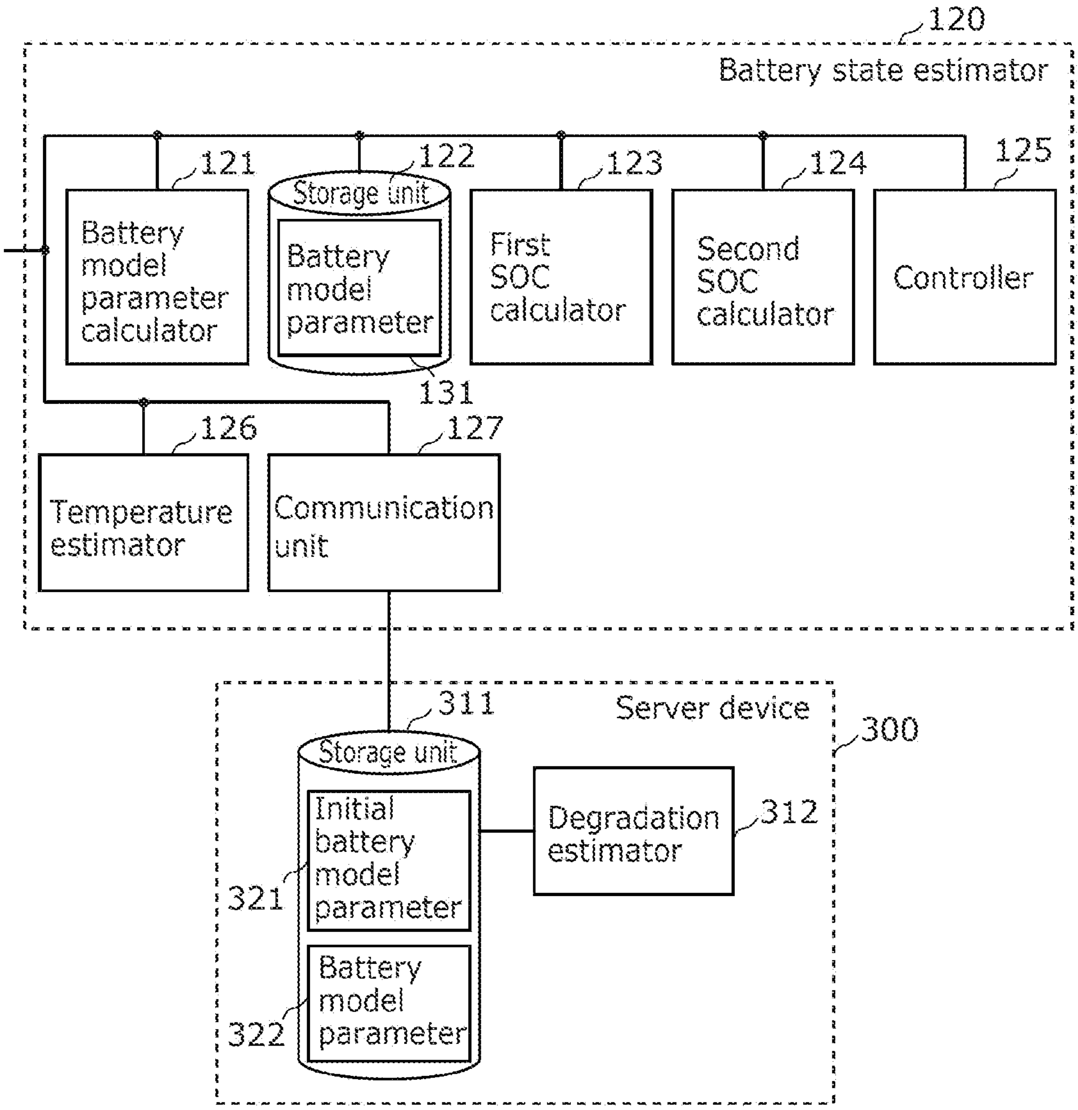
FIG. 3 is a block diagram illustrating a battery state estimator according to the embodiment and a server device.

Battery state estimator 120 calculates the SOCs and battery parameters of batteries B0 through B7 using the AC impedances calculated by AC impedance calculator 118. FIG. 3 is a block diagram illustrating battery state estimator 120 and server device 300. Battery state estimator 120 includes battery model parameter calculator 121, storage unit 122, first SOC calculator 123, second SOC calculator 124, controller 125, temperature estimator 126, and communication unit 127.

Battery model parameter calculator 121 calculates battery model parameter 131 of a battery based on the AC impedance of the battery. Storage unit 122 stores battery model parameter 131. First SOC calculator 123 calculates a first SOC using a first method (e.g., a Kalman filtering (KF) method) that uses battery model parameter 131. Second SOC calculator 124 calculates a second SOC using a second method (e.g., a Coulomb counting (CC) method).

Controller 125 performs, for instance, the process of updating battery model parameter 131 using the first SOC and the second SOC. Temperature estimator 126 estimates the internal temperature of a battery.

Communication unit 127 is a communication circuit for battery state estimation device 100 to communicate with, for instance, server device 300. For example, communication unit 127 is used for transmission and reception of a battery model parameter to and from server device 300. Communication performed by communication unit 127 may be wireless or wired. The communication standard of communication performed by communication unit 127 is not particularly limited.

Server device 300 includes storage unit 311 and degradation estimator 312. Storage unit 311 stores initial battery model parameter 321 that is a battery model parameter in the initial state of a battery and battery model parameter 322 that is a battery model parameter in the current state of the battery. Degradation estimator 312 estimates the degradation of a battery using initial battery model parameter 321 and battery model parameter 322. For example, degradation estimator 312 calculates SOH using initial battery model parameter 321 and battery model parameter 322.

The functions of processing units included in battery state estimator 120 and server device 300 may be implemented by a processor executing a program, by a dedicated circuit, or by a combination thereof.

The division of functions between battery state estimation device 100 and server device 300 described herein is one example. Some of the functions of processing units included in battery state estimation device 100 may be included in server device 300, or some or all of the functions of processing units included in server device 300 may be included in battery state estimation device 100.

Figure 4:
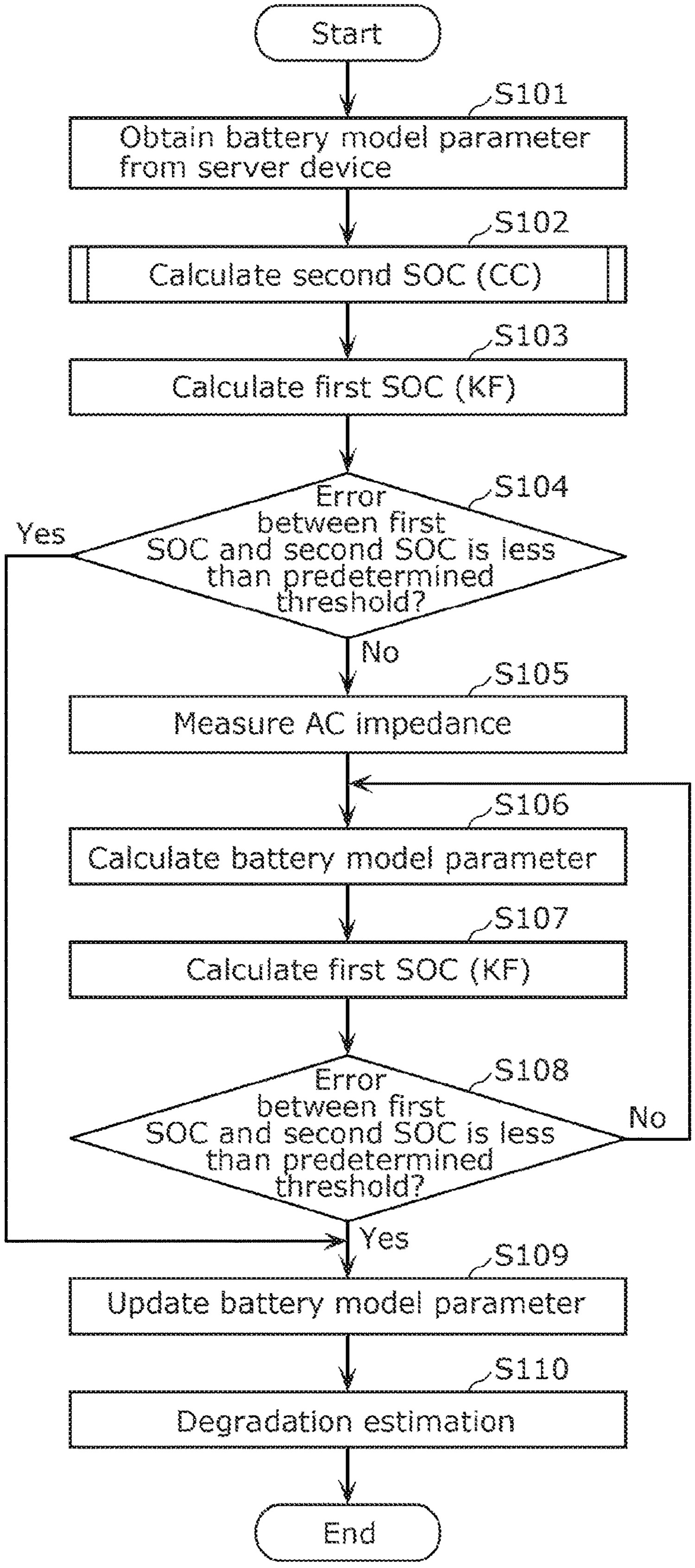
FIG. 4 is a flowchart illustrating an operation of the battery state estimation system according to the embodiment.

Next, the operation of battery state estimation system 200 will be described. FIG. 4 is a flowchart illustrating the operation of battery state estimation system 200.

First, when power is turned ON, controller 125 obtains a battery model parameter from server device 300 (S101). The battery model parameter obtained here is an initial battery model parameter when server device 300 is activated for the first time, and is battery model parameter 322 (the battery model parameter obtained in the previous measurement) in the other cases. Controller 125 stores the obtained battery model parameter in storage unit 122 as battery model parameter 131. These battery model parameters include the battery model parameter of each of batteries B0 through B7.

Figure 5:
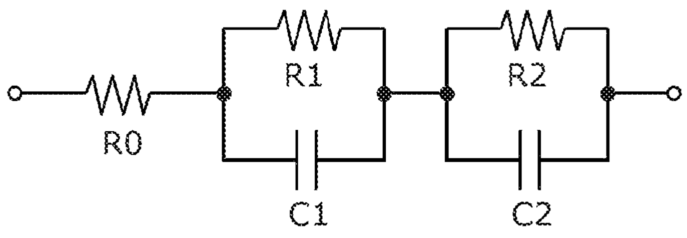
FIG. 5 is a diagram illustrating the equivalent circuit of a battery according to the embodiment.

FIG. 5 is a diagram illustrating an example of a battery model that is the equivalent circuit of battery B. It is conceivable, as can be seen from FIG. 5, that battery B has a circuit configuration in which the following are series connected to each other: resistance R0; resistance R1 and capacitor element C1 connected in parallel; and resistance R2 and capacitor element C2 connected in parallel. Battery model parameters include, for example, the values of R0, R1, R2, C1, and C2 illustrated in FIG. 5.

In the example here, a battery model is presented as including three resistances and two capacitors, but the number of resistances and the number of capacitors are not limited to this example. For example, a battery model may be presented as including four or more resistances and three or more capacitors. Moreover, the number of resistances may be same as or different from the number of capacitors.

Subsequently, second SOC calculator 124 calculates a second SOC based on a current cumulative value using the second method (the CC method) (S102). Other publicly known SOC calculation method may be used as the second method. The second method may be, for example, an open circuit voltage (OCV) method.

Subsequently, first SOC calculator 123 calculates a first SOC using the first method (the KF method) that uses battery model parameter 131 (S103). A publicly known method of calculating SOC from a battery model parameter, besides the KF method, may be used as the first method of calculating a first SOC.

Subsequently, controller 125 calculates the error between the first SOC and the second SOC, and determines whether the calculated error is less than a predetermined threshold (S104). The error here may be the difference value between the first SOC and the second SOC (or the absolute value of the difference value), or a value (%) resulting from dividing the difference value (or the absolute value of the difference value) by the first SOC or the second SOC. The predetermined threshold is not particularly limited, but may be, for example, in the range of approximately from 1% to 5% when the latter value is used.

When the error is the predetermined threshold or greater (No in S104), controller 125 instructs AC impedance measurement unit 110 to perform AC impedance measurement, and AC impedance measurement unit 110 performs AC impedance measurement (S105).

Specifically, signal generator 114 generates a control signal having frequency components, and applies the generated control signal to the control terminal of transistor 104. Subsequently, current measurer 112 measures current Iac flowing through reference resistance 103. Subsequently, voltage measurer 115 measures voltages V0 through V7 of batteries B0 through B7. Then, AC impedance calculator 118 calculates the AC impedances of batteries B0 through B7 based on the measured current Iac and the measured voltages V0 through V7.

Specifically, AC impedance calculator 118 converts current Iac to a complex current and converts voltages V0 through V7 to complex voltages. AC impedance calculator 118 performs an averaging process of averaging complex currents and an averaging process of averaging complex voltages, and calculates the AC impedance of a battery by dividing a complex voltage resulting from the complex voltage averaging process by a complex current resulting from the complex current averaging process. For example, impedance real portion Z0*re* and impedance imaginary portion Z0*im* are output as the AC impedance of battery B0. AC impedance calculator 118 may correct the AC impedance based on temperature Tmoni measured by temperature measurer 111.

Subsequently, battery model parameter calculator 121 calculates a battery model parameter from the AC impedance (S106). Battery model parameter calculator 121 also stores the calculated battery model parameter in storage unit 122.

Figure 6:
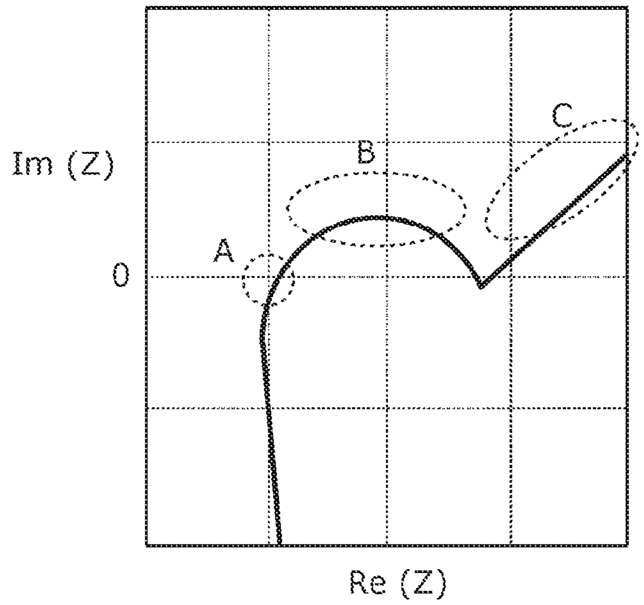
FIG. 6 is a diagram illustrating the AC impedance of the battery according to the embodiment.

FIG. 6 is a diagram illustrating the AC impedance of battery B. FIG. 6 is a diagram referred to as a Cole-Cole plot and is also referred to as a Nyquist plot. The characteristics of area A illustrated in the diagram depend on R0 illustrated in FIG. 5, the characteristics of area B depend on R1 and C1, and the characteristics of area C depend on R2 and C2. The battery model parameter of battery B can be therefore calculated from the characteristics of each of the frequencies of the AC impedance.

Figure 7:
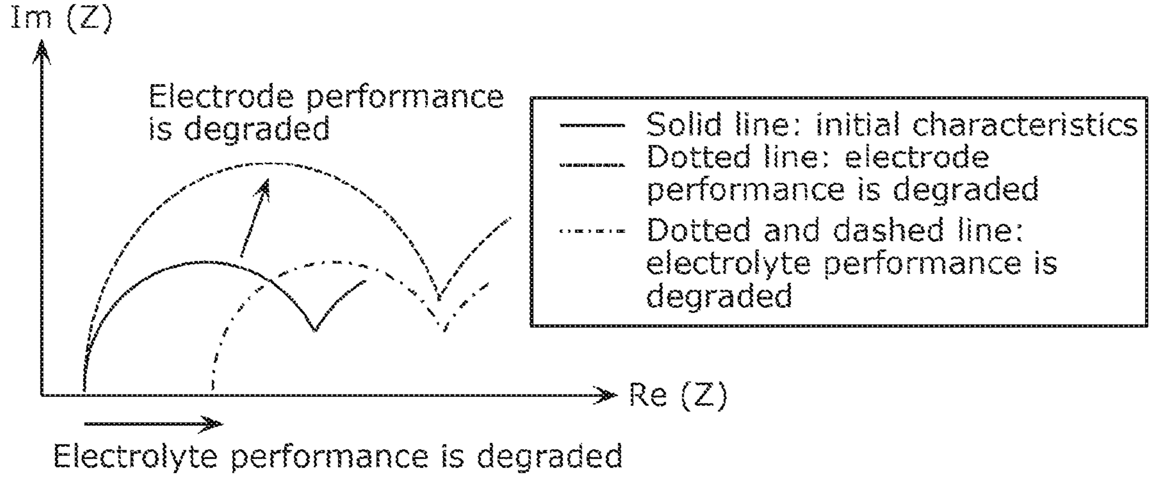
FIG. 7 is a diagram illustrating the relationship between a change in the AC impedance of the battery according to the embodiment and battery degradation.

The battery model parameter changes due to battery B being degraded. In other words, the AC impedance of battery B changes due to the degradation of battery B. FIG. 7 is a diagram illustrating the relationship between a change in the AC impedance of battery B and the degradation of battery B. The AC impedance of battery B has initial characteristics indicated by the solid line in FIG. 7. The characteristics of the AC impedance of battery B change to the characteristics indicated by the dashed line in FIG. 7 when the electrode performance of battery B is degraded. The characteristics of the AC impedance of battery B change to the characteristics indicated by the dotted and dashed line in FIG. 7 when the electrolyte performance of battery B is degraded.

Subsequently, first SOC calculator 123 calculates a first SOC using the first method (the KF method) that uses battery model parameter 131 calculated in step S106 (S107). Subsequently, controller 125 calculates the error between the first SOC and the second SOC, and determines whether the calculated error is less than the predetermined threshold (S108). The threshold is not particularly limited, but may be, for example, in the range of approximately from 1% to 5%. The threshold used herein may be same as or different from the threshold used in step S104.

When the error is the predetermined threshold or greater (No in S108), battery model parameter calculator 121 recalculates a battery model parameter from the AC impedance (S106). In this case, the battery model parameter is calculated using, for example, a calculation parameter different from the calculation parameter used in the previous calculation. The process in step S107 and the following processes are performed using the newly calculated battery model parameter. In other words, steps S106 and S107 are repeated until the error is less than the predetermined threshold, while changing the calculation parameter.

When the error is less than the predetermined threshold (Yes in S108), controller 125 sends the current battery model parameter 131 to server device 300 and updates battery model parameter 322 stored in storage unit 311 (S109). Battery model parameter 322 includes, for example, battery model parameters of different dates and times, to each of which date and time information is added. In other words, battery model parameter 322 includes battery model parameters calculated in the past. Battery model parameter 322 may include only the latest battery model parameter.

In step S104, when the error is less than the predetermined threshold (Yes in S104), controller 125 sends the current battery model parameter 131 to server device 300 and updates battery model parameter 322 stored in storage unit 311 (S109).

Subsequently, degradation estimator 312 calculates the current SOH of each battery using initial battery model parameter 321 and the latest updated battery model parameter (S110). Any one of various publicly known calculation methods is used for estimating SOH from battery model parameters. The calculated SOH may be associated with date and time information and stored in storage unit 311. The processes in steps S102 through S110 illustrated in FIG. 4 are repeatedly performed at predetermined intervals.

As described above, in the present embodiment, SOC can be estimated with high accuracy by calculating a first SOC (KF) using a second SOC (CC) as a reference. Since this enables estimating a battery model parameter with high accuracy, SOH can be estimated with high accuracy.

Figure 8:
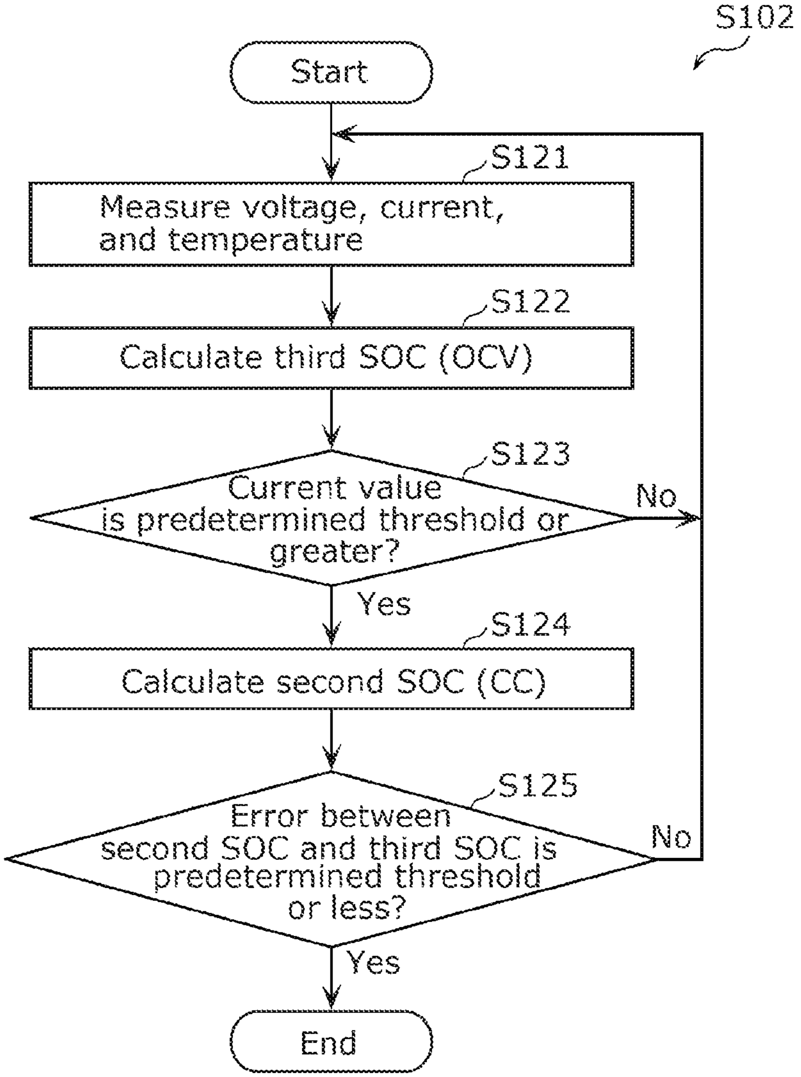
FIG. 8 is a flowchart illustrating a second SOC calculation process according to the embodiment.

Next, the details of the second SOC calculation will be described. FIG. 8 is a flowchart illustrating the details of the second SOC calculation process (S102 in FIG. 4). First, AC impedance measurement unit 110 measures voltages V0 through V7, current Icc, and temperature Tmoni (S121). Subsequently, second SOC calculator 124 calculates a third SOC using a third method (e.g., an OCV method) (S122).

It is presupposed here that when step S102 is started, neither charge nor discharge is performed for a certain period of time (current is not flowing through load 102). For example, step S102 may be started when it is detected that neither charge nor discharge is performed for a certain period of time. The expression "current is not flowing" means that battery B is stable.

As described above, a third SOC (OCV) that is the true value of battery B can be calculated in step S122 using voltages V0 through V7, current Icc, and temperature Tmoni measured in step S121.

Subsequently, controller 125 determines whether current Icc is a predetermined threshold or greater (S123). When current Icc is less than the predetermined threshold (No in S123), the process in step S121 and the following processes are performed again after a predetermined time has elapsed.

When current Icc is the predetermined threshold or greater (Yes in S123), second SOC calculator 124 calculates a second SOC using the second method (e.g., the CC method) (S124). For example, SOC calculated using the CC method depends on full charge capacity (FCC). For example, SOC is expressed by the current amount of electric charge/FCC. For this reason, deviation occurs also in the second SOC if FCC decreases due to degradation. This may cause the flow of step S102 to loop infinitely. FCC correction is performed as a countermeasure therefor. Specifically, FCC is corrected using the value of the third SOC (OCV) calculated in step S122 and the value of the second SOC (CC) calculated in step S124.

For example, a new battery is assumed to have a full charge voltage of 4.1 V and an initial capacitance of 10 Ah (FCC0). When this battery is used and the battery is degraded, the current capacitance value Ah (FCCx) is unknown. When the value of the third SOC (OCV) comes to indicate a full charge voltage of 4.1 V owing to the battery being charged, a current cumulative value (the second SOC (CC)) below 4.1 V is regarded as the current capacitance value Ah (FCCx).

Subsequently, controller 125 calculates the error (the amount of change) between the second SOC and the third SOC, and determines whether the calculated error is a predetermined threshold or less (S125). For example, controller 125 determines whether the calculated error falls within a predetermined range. The threshold is not particularly limited, but may be in the range of approximately from 1% to 5% when the ratio between the second SOC and the third SOC is used, for example. The threshold used herein may be same as or different from the threshold used in step S104 or S108.

When the calculated error is greater than the predetermined threshold (No in S125), the process in step S121 and the following processes are performed again after a predetermined time has elapsed. When the calculated error is the predetermined threshold or less (Yes in S125), the second SOC calculated in step S124 is used in the process in step S103 and the following processes illustrated in FIG. 4.

Figure 9:
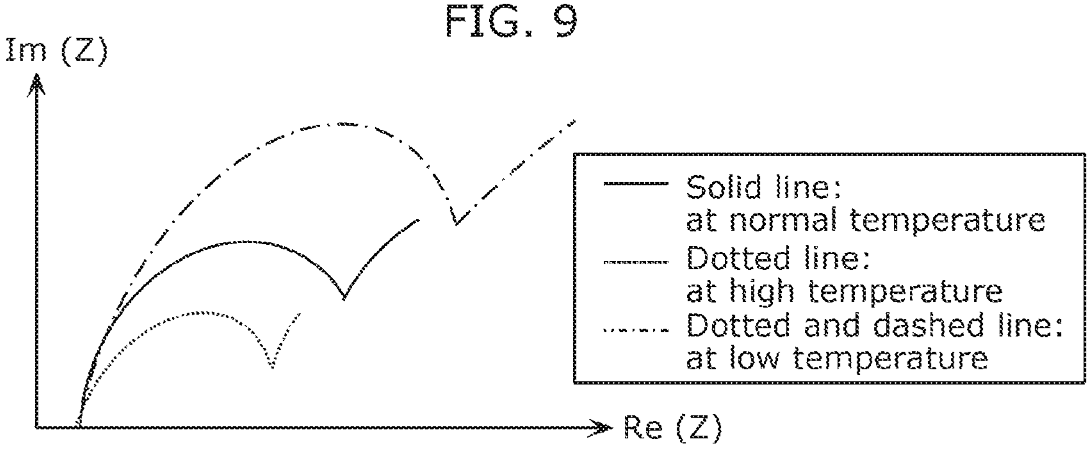
FIG. 9 is a diagram illustrating an example of temperature dependency of AC impedance according to the embodiment.
Figure 10:
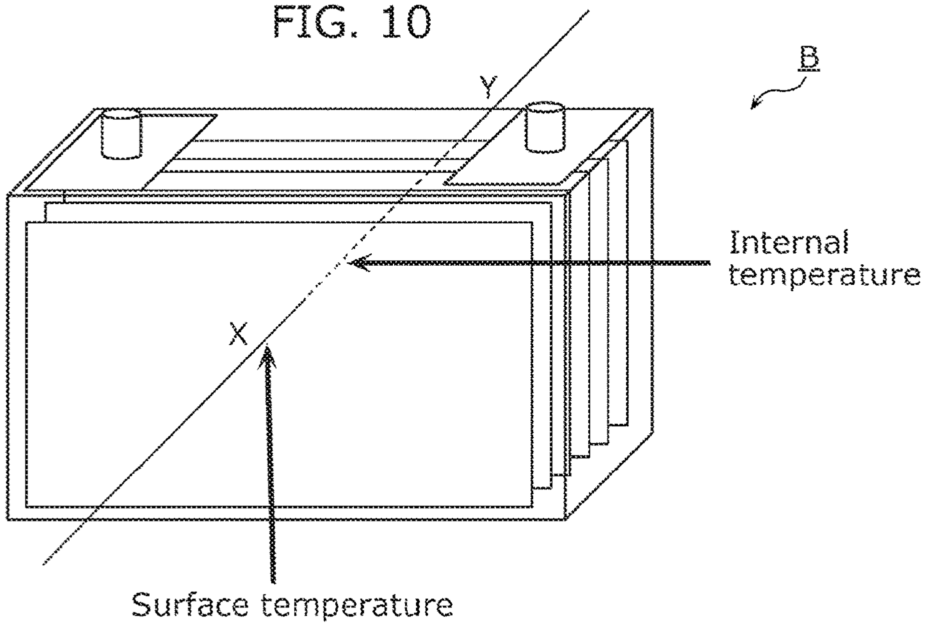
FIG. 10 is a diagram illustrating the outer appearance of the battery according to the embodiment.
Figure 11:
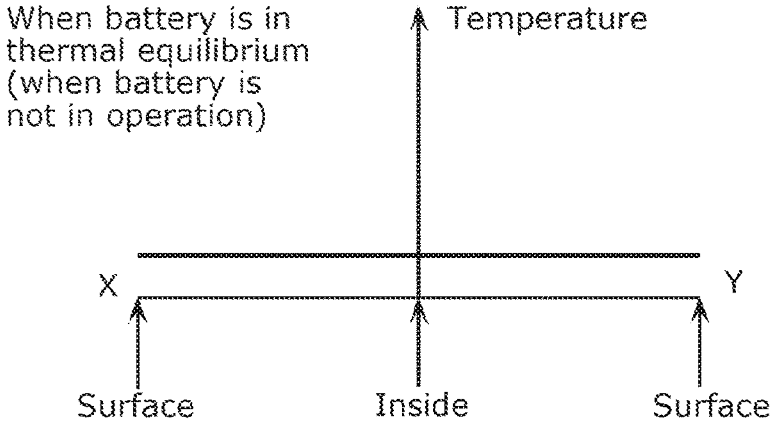
FIG. 11 is a diagram illustrating the internal temperature of the battery according to the embodiment when the battery is in thermal equilibrium.
Figure 12:
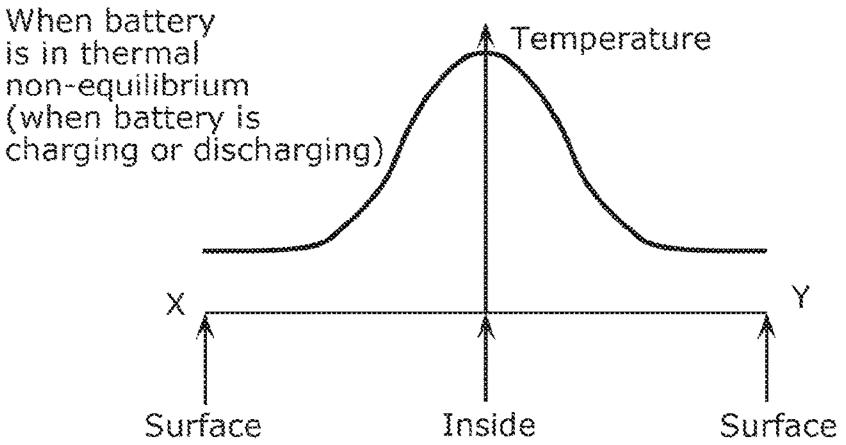
FIG. 12 is a diagram illustrating the internal temperature of the battery according to the embodiment when the battery is in thermal non-equilibrium.

The AC impedance of a battery changes according to the temperature of the battery. FIG. 9 is a diagram illustrating an example of temperature dependency of AC impedance. FIG. 10 is a diagram illustrating the outer appearance of battery B (a battery cell). FIG. 11 and FIG. 12 are each a diagram illustrating an example of a temperature at line X-Y in FIG. 10. FIG. 11 illustrates a temperature when battery B is in thermal equilibrium, and FIG. 12 illustrates a temperature when battery B is in thermal non-equilibrium. The expression "battery B is in thermal equilibrium" means that battery B is not in operation and battery B is neither charging nor discharging. The expression "battery B is in thermal non-equilibrium" means that battery B is in operation and battery B is either charging or discharging.

When battery B is in thermal non-equilibrium, a temperature at the surface of battery B differs from a temperature inside battery B, as illustrated in FIG. 12. Temperature Tmoni obtained by temperature measurer 111 is a temperature at the surface of battery B. Consequently, when battery B is in thermal non-equilibrium, temperature Tmoni is different from the actual internal temperature of battery B.

AC impedance calculator 118 may therefore calculate the AC impedances of batteries B0 through B7 based on current Iac, voltages V0 through V7, and temperature Tmoni that are obtained when batteries B0 through B7 are in thermal equilibrium. This enables calculating highly accurate AC impedances.

Alternatively, AC impedance calculator 118 may calculate the AC impedances of batteries B0 through B7 based on current Iac, voltages V0 through V7, and temperature Tmoni that are obtained when batteries B0 through B7 are in thermal non-equilibrium. This enables AC impedance calculator 118 to measure the AC impedances of batteries even during charge or discharge of the batteries. The AC impedances of the batteries can be therefore measured without limiting the operation of a higher-level system (e.g., vehicle control or the like in the case where battery state estimation system 200 is installed in a vehicle).

Determining whether a battery is in thermal equilibrium or in thermal non-equilibrium may be performed based on, for example, a control signal that is provided from a higher-level system and indicates operation or non-operation of the battery. Operation or non-operation of the battery may be determined based on, for instance, current Icc.

AC impedance calculator 118 may calculate the AC impedance of a battery using the temperature of the battery which is estimated by temperature estimator 126. This enables calculating highly accurate AC impedance even when a battery is in thermal non-equilibrium.

For example, temperature estimator 126 estimates the temperature of a battery from the second SOC (CC) obtained in step S102 and the AC impedance obtained in step S105, using a table indicating the correspondence relationship of a preset temperature, SOC, and AC impedance. AC impedance calculator 118 corrects the calculated AC impedance to an AC impedance corresponding to when the temperature of the battery is normal, using the relationship between AC impedance at the estimated temperature and AC impedance at a normal temperature (e.g., when the temperature is a predetermined temperature and the battery is in thermal equilibrium).

As described above, battery state estimation device 100 includes: first state of charge (SOC) calculator 123 that calculates a first SOC using a first method that uses the battery model parameter of battery B; second SOC calculator 124 that calculates a second SOC using a second method different from the first method; AC impedance measurement unit 110 that measures the AC impedance of the battery when the error between the first SOC and the second SOC is greater than a predetermined threshold; and battery model parameter calculator 121 that calculates a battery model parameter using the measured AC impedance. First SOC calculator 123 recalculates the first SOC using the calculated battery model parameter.

This enables battery state estimation device 100 to enhance, with the use of a second SOC as a reference, the accuracy of a first SOC obtained using the battery model parameter of a battery, as well as the accuracy of a battery model parameter to be calculated. Battery state estimation device 100 can thus achieve highly accurate battery state estimation.

For example, battery state estimation device 100 further includes controller 125 that when the error between the first SOC and the second SOC is less than the predetermined threshold, updates a battery model parameter stored in storage unit 311 (or 122) with the battery model parameter used for the calculation of the first SOC. This enables battery state estimation device 100 to, for example, obtain the transition of the battery model parameter in a chronological order.

The first method is, for example, a Kalman filtering (KF) method. This enables battery state estimation device 100 to compare an estimated value and a measured voltage, calculate a Kalman gain which is the weighting factor of an error using the KF method, and correct the estimated value using the Kalman gain. This enables fitting mainly in a lower frequency region.

The second method is, for example, a Coulomb counting (CC) method. This enables battery state estimation device 100 to prevent a first SOC from resulting in a wrong value by setting a second SOC as a reference.

The second method is, for example, an open circuit voltage (OCV) method. This enables battery state estimation device 100 to estimate SOC with high accuracy even when an application is being stopped.

For example, AC impedance measurement unit 110 measures the AC impedance of battery B during charge or discharge of battery B. This enables battery state estimation device 100 to measure the AC impedance of a battery even during charge or discharge of the battery and detect the state of the battery, without limiting the operation of an application.

For example, AC impedance measurement unit 110 measures the AC impedance of battery B when battery B is in thermal equilibrium. This enables battery state estimation device 100 to measure the AC impedance of a battery with high accuracy.

For example, storage unit 311 is included in server device 300 provided in a location different from the location of battery state estimation device 100. Battery state estimation device 100 further includes communication unit 127 that communicates with server device 300 via a communication network. Since this allows access to battery model parameters from outside, degradation tendency can be visualized.

Battery state estimation system 200 includes battery state estimation device 100 and server device 300. Storage unit 311 stores the initial battery model parameter of battery B, and server device 300 estimates the state of degradation of the battery using the initial battery model parameter and the updated battery model parameter. This enables battery state estimation system 200 to determine the degradation of a battery component by comparing an initial battery model parameter with an updated battery model parameter.

Although an embodiment of the present disclosure has been described above, the present disclosure is not limited to the above-described embodiment.

Although a battery state estimation device and a battery state estimation system that target batteries used in a vehicle such as an EV have been described in the above-described embodiment, the battery state estimation device and the battery state estimation system may target batteries used in any application.

Each of the circuit configurations described in the above-described embodiment is one example and the present disclosure is not limited to the circuit configurations described above. In other words, a circuit that can implement the characteristic features of the present disclosure, like any one of the circuit configurations described above, is also included in the present disclosure. For example, a circuit in which elements such as a switching element (a transistor), a resistor element, and a capacitor element are connected in series or in parallel to a given element in a range that can implement the same functions as those of any one of the circuit configurations described above is also included in the present disclosure.

In the above-described embodiment, elements included in an integrated circuit are implemented by hardware. However, some of the elements in the integrated circuit may be implemented by executing a software program suitable for the element or by a program executor, such as a central processing unit (CPU) or a processor, reading and executing a software program recorded on a recording medium such as a hard disk or a semiconductor memory.

In the above-described embodiment, a process performed by a specific processing unit may be performed by a different processing unit. In an operation described in the above-described embodiment, the order of processes may be changed or processes may be performed in parallel.

Other embodiments obtained by various modifications of the embodiments that may be conceived by persons skilled in the art, as well as embodiments resulting from arbitrary combinations of elements and functions from different embodiments that do not depart from the essence of the present disclosure are also included in the present disclosure.

The invention claimed is:

1. A battery state estimation device for a battery mounted in an electric vehicle, the battery being connected to a load including a motor of the electric vehicle, the battery state estimation device comprising:

a processor configured to perform operations comprising:

calculating a first state of charge (SOC) using a first method that uses a battery model parameter of the battery;

calculating a second SOC using a second method different from the first method;

measuring an alternating-current (AC) impedance of the battery when an error between the first SOC and the second SOC is greater than a predetermined threshold;

calculating a battery model parameter using the AC impedance measured; and recalculating the first SOC using the battery model parameter, wherein the measuring the AC impedance comprises causing a signal generator to apply, to a control terminal of a transistor, a control signal having frequency components to cause current to flow from the battery to a reference resistance through the transistor, the reference resistance being disposed on a path different from a path along which current flows from the battery to the load.

2. The battery state estimation device according to claim 1, wherein the operations further comprise:

when the error between the first SOC and the second SOC is less than the predetermined threshold, updating a battery model parameter stored in a storage with the battery model parameter used for the calculation of the first SOC.

3. The battery state estimation device according to claim 1, wherein the first method is a Kalman filtering (KF) method.

4. The battery state estimation device according to claim 3, wherein the second method is a Coulomb counting (CC) method.

5. The battery state estimation device according to claim 3, wherein the second method is an open circuit voltage (OCV) method.

6. The battery state estimation device according to claim 1, wherein the measuring the AC impedance comprises measuring the AC impedance during charge or discharge of the battery.

7. The battery state estimation device according to claim 1, wherein the measuring the AC impedance comprises measuring the AC impedance when the battery is in thermal equilibrium.

8. The battery state estimation device according to claim 2, the storage is included in a server provided in a location different from a location of the battery state estimation device, and the operations further comprise communicating with the server device via a communication network.

9. A battery state estimation system comprising:

the battery state estimation device according to claim 8; and the server, wherein the storage stores an initial battery model parameter of the battery, and the server estimates a state of degradation of the battery using the initial battery model parameter and the battery model parameter updated.

10. A battery state estimation method for a battery mounted in an electric vehicle, the battery being connected to a load including a motor of the electric vehicle, the method comprising:

calculating a first state of charge (SOC) using a first method that uses a battery model parameter of the battery;

calculating a second SOC using a second method different from the first method;

measuring an alternating-current (AC) impedance of the battery when an error between the first SOC and the second SOC is greater than a predetermined threshold;

calculating a battery model parameter using the AC impedance measured; and recalculating the first SOC using the battery model parameter calculated, wherein the measuring the AC impedance comprises causing a signal generator to apply, to a control terminal of a transistor, a control signal having frequency components to cause current to flow from the battery to a reference resistance through the transistor, the reference resistance being disposed on a path different from a path along which current flows from the battery to the load.

* * * * *